United States Patent
Kotowicz

(10) Patent No.: US 9,995,324 B2
(45) Date of Patent: Jun. 12, 2018

(54) PRESSURE COMPENSATION DEVICE AND HOUSING COMPONENT

(71) Applicant: CONTINENTAL AUTOMOTIVE GMBH, Hannover (DE)

(72) Inventor: Edward Kotowicz, Tegernheim (DE)

(73) Assignee: Continental Automotive GmbH, Hannover (DE)

( * ) Notice: Subject to any disclaimer, the term of this patent is extended or adjusted under 35 U.S.C. 154(b) by 216 days.

(21) Appl. No.: 14/652,895

(22) PCT Filed: Dec. 2, 2013

(86) PCT No.: PCT/EP2013/075209
§ 371 (c)(1),
(2) Date: Jun. 17, 2015

(87) PCT Pub. No.: WO2014/095320
PCT Pub. Date: Jun. 26, 2014

(65) Prior Publication Data
US 2015/0330421 A1   Nov. 19, 2015

(30) Foreign Application Priority Data

Dec. 17, 2012 (DE) .......................... 10 2012 223 332

(51) Int. Cl.
*F16L 55/04*    (2006.01)
*F15B 20/00*    (2006.01)
(Continued)

(52) U.S. Cl.
CPC ............ *F15B 20/00* (2013.01); *F21S 48/332* (2013.01); *F21V 31/03* (2013.01); *H05K 5/0213* (2013.01); *F15B 2201/00* (2013.01)

(58) Field of Classification Search
CPC ................................ F15B 20/00; F21S 48/332
(Continued)

(56) References Cited

U.S. PATENT DOCUMENTS 7,357,709 B2 * 4/2008 Zukor .................... G03B 17/02
454/270
2003/0220067 A1 * 11/2003 Mashiko ................. F21V 31/03
454/254
(Continued)

FOREIGN PATENT DOCUMENTS

DE    102007050921 A1    5/2009
DE    102008001595 A1    11/2009
(Continued)

*Primary Examiner* — Vishal Pancholi
(74) *Attorney, Agent, or Firm* — Laurence A. Greenberg; Werner H. Stemer; Ralph E. Locher

(57) ABSTRACT

A pressure compensating device includes a diaphragm and a holding element. The holding element has a bearing surface facing the diaphragm. A cohesive or materially-bonded connection is formed at the bearing surface between the diaphragm and the holding element. The diaphragm is fixed to the bearing surface of the holding element by the cohesive connection. A cover which is fixed to the holding element has at least one first receiving device or receptacle at least partly receiving the diaphragm. The cover presses the diaphragm at least partly onto the cohesive connection and presses the cohesive connection onto the bearing surface of the holding element. A housing component having a pressure compensating device and a control unit having a housing are also provided.

15 Claims, 2 Drawing Sheets

(51) Int. Cl.
*F21S 8/10* (2006.01)
*F21V 31/03* (2006.01)
*H05K 5/02* (2006.01)

(58) Field of Classification Search
USPC .......................................................... 138/30
See application file for complete search history.

(56) References Cited

U.S. PATENT DOCUMENTS

| | | | | |
|---|---|---|---|---|
| 2009/0047890 | A1* | 2/2009 | Yano | .................... B65D 77/225 |
| | | | | 454/143 |
| 2011/0016836 | A1* | 1/2011 | Yano | ................... B60R 16/0239 |
| | | | | 55/491 |
| 2012/0048871 | A1* | 3/2012 | Chiu | ..................... H05K 5/0213 |
| | | | | 220/745 |

FOREIGN PATENT DOCUMENTS

| | | |
|---|---|---|
| EP | 0377067 A1 | 7/1990 |
| EP | 1879439 A1 | 1/2008 |
| EP | 1921020 A1 | 5/2008 |
| JP | 2010171227 A | 8/2010 |
| WO | 03080389 A1 | 10/2003 |

* cited by examiner

PRESSURE COMPENSATION DEVICE AND HOUSING COMPONENT

BACKGROUND OF THE INVENTION

Field of the Invention

The invention relates to a pressure compensating device having a diaphragm and a holding element, wherein the holding element comprises a bearing surface which faces the diaphragm, wherein a materially-bonded connection, which is designed to fasten the diaphragm on the bearing surface of the holding element, is realized on the bearing surface between the diaphragm and the holding element.

Pressure compensating devices with a diaphragm and a holding element are known. The diaphragm, in this case, is realized to keep liquids, in particular water, or particles from penetrating into a housing. In addition, gases are able to pass through the diaphragm such that the pressure inside the housing corresponds substantially to that of the surrounding area and consequently leakages at possible sealing elements are avoided. The diaphragm is usually bonded for fastening the diaphragm on the holding element. However, the elastic characteristics and the sealing characteristics of the bond, on the one hand, tend to change and, on the other hand, it is possible for a bearing surface, on which the adhesive connection abuts against the holding element, possibly to corrode.

BRIEF SUMMARY OF THE INVENTION

It is an object of the invention to provide a pressure compensating device for a housing which is more corrosion-resistant and has more long-term stability.

Said object is achieved by means of a pressure compensating device with the features recited below. Advantageous embodiments are provided in the dependent claims.

According to a first aspect, a pressure compensating device is provided which can also be designated as a pressure compensating arrangement. According to a second aspect, a housing component with the pressure compensating device is provided. According to a third aspect, a housing with the housing component is provided. The housing is preferably the housing of an electrical or electronic unit, for example of a control unit such as an engine control unit of a motor vehicle. For example, the housing includes a printed circuit board that is equipped with electric and/or electronic components.

The pressure compensating device is realized by means of the diaphragm preferably for the purpose of preventing the ingress of liquids, in particular water, or of particles into the housing. In this case, the diaphragm is gas-permeable such that pressure compensation in particular between the housing internal pressure and the ambient pressure is achievable by means of the pressure compensation device.

It has been recognized according to the invention that an improved pressure compensation device can be provided as a result of the pressure compensating device comprising a diaphragm and a holding element. The holding element comprises a bearing surface which faces the diaphragm. The bearing surface is, for example, a part region of an outside surface of the housing component. The holding element is, for example, formed by a portion of the housing component.

A materially-bonded connection, which is designed to fasten the diaphragm on the bearing surface of the holding element, is realized on the bearing surface between the diaphragm and the holding element. In the case of the finished pressure compensation device, the diaphragm is consequently fastened on the bearing surface of the holding element by means of the materially-bonded connection. For example, the materially-bonded connection is produced by means of an adhesive layer and/or a weld seam—e.g. an ultrasound weld seam. In this case, the bearing surface encloses a passage of the housing component in particular at the side and the diaphragm covers the passage. In this way, the passage of the housing component is closed by means of the diaphragm and the materially-bonded connection.

In addition, the pressure compensating device comprises a cover which is fastened on the holding element. The cover has at least one first receiving means which is realized to receive the diaphragm at least in part. In the case of the finished pressure compensation device, the diaphragm is received in the first receiving means at least in part. The cover presses, at least in places, the diaphragm onto the materially-bonded connection and the materially-bonded connection against the bearing surface of the holding element. In the case of one embodiment, the cover is fastened on the holding element by means of a clamping connection in order to secure the diaphragm against detachment from the bearing surface in addition to the materially-bonded connection as a result of pressing.

The advantage of said development is that the pressure compensating device is more corrosion-resistant and additionally the materially-bonded connection is more stable over the long-term as a result of the pressing pressure provided. As a result, improved sealing characteristics are achievable on the pressure compensating device such that an ingress of liquids into a housing, on which the pressure compensating device is arranged, is avoided in a reliable manner.

It is particularly advantageous when the first receiving means includes a pressure surface which is aligned and realized parallel to the bearing surface of the holding element to abut against the membrane at least in part. In the case of the finished pressure compensation device, the pressure surface abuts at least in places against the diaphragm. The diaphragm being pressed in a reliable and flat manner onto the materially-bonded connection is ensured in this way. Further possibly local leakages are also reliably excluded as a result.

It is particularly advantageous in this connection when the bearing surface and the pressure surface are realized in an identical manner, in particular therefore so as to be congruent when looking at the diaphragm in top view.

In a further embodiment, the cover comprises a first cover element and a second cover element which is connected to the first cover element, wherein the first cover element is realized in a hollow cylindrical manner, wherein the second cover element has a cylindrical portion which is encompassed at least in part on the circumferential side by the first cover element. A cover that is simple to produce can be provided in this way.

In a further embodiment, the first receiving means is arranged in the second cover element, wherein at least one holding portion is realized on the second cover element on the circumferential side of the first receiving means. The holding element has a web which extends substantially perpendicularly to the bearing surface. The holding portion of the second cover element is realized to be clamped on the web in order to fasten the cover on the holding element. In the case of the finished pressure compensation device, the holding portion is clamped in particular on the web. The cover can be fastened on the holding element in simple manner in this way. Mounting the cover on the holding element in an automated and consequently cost-efficient manner is also possible as a result of this.

A particularly good clamping connection is provided as a result of a second receiving means, into which the holding portion of the second cover element engages, being realized on the web on a side surface which faces the cover.

A particularly flat pressure compensating device can be provided as a result of at least one protrusion, which is realized to receive the holding portion of the second cover element at least in part, being formed in the holding element between the bearing surface and the web.

In a further embodiment, the second cover element comprises a radially outwardly open passage in the cylindrical portion, wherein the passage is covered at least in part by the first cover element. A jet of liquid onto the diaphragm can be reliably avoided in this way. As a result, overloading or destroying the materially-bonded connection can be reliably avoided.

In a further embodiment, the holding element, adjoining the bearing surface, includes at least one stop element which extends in the direction of the cover, wherein the stop element is realized to delimit a mounting direction—this means within the present context in particular a movement of the cover toward the bearing surface—by the cover striking against the stop element. The stop element is, for example, a projection of the bearing surface. The risk of over-pressing or destroying the adhesive layer is reduced in this way or a minimum layer thickness of the materially-bonded connection, in particular an adhesive layer, can be established in a defined manner independent of, for example, a processing temperature of the materially-bonded connection.

It is particularly advantageous when the cover is realized as a corrosion element, wherein the cover comprises at least in part a first material with a first electrochemical potential. The holding element comprises a second material with a second electrochemical potential. The first electrochemical potential of the first material, in this case, is lower than the electrochemical potential of the second material. Corrosion of the holding element in particular in the region of the bearing surface of the materially-bonded connection can be reliably avoided in this manner such that the pressure compensation device has an increased service life.

In order to avoid contact corrosion in the region of the cover at its contact points to the holding element, in the case of one embodiment a layer, which has a third electrochemical potential which corresponds substantially to the second electrochemical potential of the second material of the holding element, is arranged on a surface of the cover.

BRIEF DESCRIPTION OF THE SEVERAL VIEWS OF THE DRAWING

The above-described characteristics, features and advantages of said invention, as well as the method in which these are achieved, will become even clearer and easier to understand in conjunction with the following description of the exemplary embodiments, which will be explained in more detail in conjunction with the drawings, wherein.

DESCRIPTION OF THE INVENTION

Figure 1:
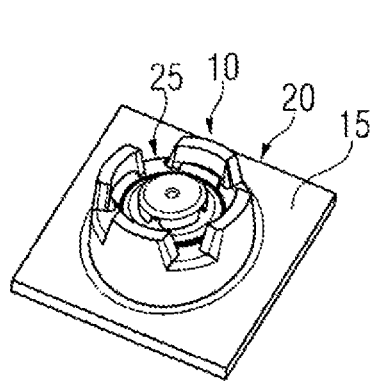
FIG. 1 shows a perspective view of a pressure compensating device on a housing.
Figure 2:
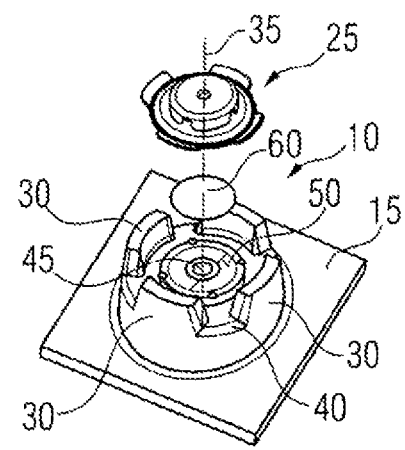
FIG. 2 shows an exploded representation of the pressure compensating device shown in FIG. 1.
Figure 3:
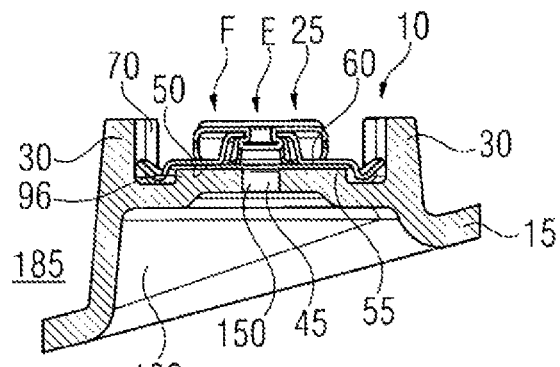
FIG. 3 shows a sectional view through the pressure compensation device shown in FIG. 1.

FIG. 1 shows a perspective view of a pressure compensation device 10 on a housing 15. FIG. 2 shows an exploded drawing of the pressure compensation device 10 shown in FIG. 1. FIG. 3 shows a sectional view through the pressure compensation device shown in FIG. 1.

The pressure compensation device 10 is arranged on the housing 15, more precisely on one of two or more housing components of the housing 15. The housing 15 is shown only in portions as an example in FIGS. 1 to 3. The pressure compensation device 10 includes a holding element 20 and a cover 25, i.e. it comprises the holding element 20 and the cover 25. The holding element 20 includes several webs 30 which are realized as annular portions, i.e. it comprises the webs 30 which are realized as annular portions. The webs 30 are arranged in portions extending circumferentially in a circular manner about a center axis 35. A trapezoidal first recess 40 is provided in each case between the webs 30. In other words, every two webs 30 are separated laterally from one another in each case by a trapezoidal first recess 40. In addition, the holding element 20 has a circular first passage 45 which is arranged centrally and the center point of which lies along the center axis 35. Obviously, other cross sections for the first passage 45 are also conceivable.

A bearing surface 50, which is realized in a flat manner, is arranged on the top in a ring-shaped manner about the first passage 45. An adhesive layer 55 is arranged on the bearing surface 50 on the top of the bearing surface 50. The adhesive layer 55 as a materially-bonded connection adheres, in this case, to the bearing surface 50. A gas-permeable, but liquid-impermeable diaphragm 60 is additionally provided on the top of the adhesive layer 55. The diaphragm 60, in this connection, is realized in a circular manner and rests on the adhesive layer 55 and is connected to the bearing surface 50 by said adhesive layer. The diaphragm 60, in this case, comprises an external diameter which corresponds substantially to that of the bearing surface. In this case, the adhesive layer 55 seals the diaphragm 60 or the housing 15 in relation to liquids. The cover 25, which is fastened on the holding element 20 by means of a clamping connection between the cover 25 and the webs 30, is arranged on the top of the diaphragm 60. In this case, the cover 25 presses onto the diaphragm 60 with a pressing force F in the direction of the center axis 35 and consequently secures the diaphragm 60 against detachment from the bearing surface 50 or the adhesive layer 55 in addition to the adhesive layer 55. A pressure compensating device 10, which is more durable over the long term than known pressure compensation devices is provided as a result as embrittlement of the adhesive layer 55 or detachment of the diaphragm 60 from the bearing surface 50 can be reliably avoided as a result of the additional pressing force F of the cover 25 onto the diaphragm 60 or the adhesive layer 55. In addition, the pressing force 11 also ensures that even in the case of embrittlement or in the case of a fault in the adhesive layer 55, the diaphragm 60 is pressed onto the bearing surface 50 and consequently ingress of liquids into the housing 15 between the diaphragm 60 and the bearing surface 50 can be reliably avoided.

Figure 4:
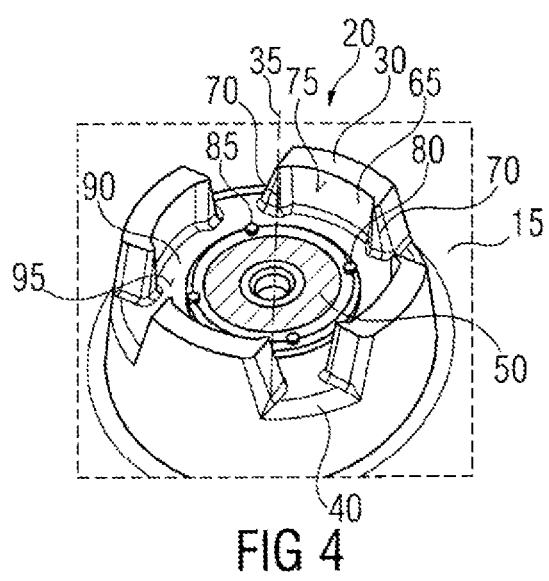
FIG. 4 shows a perspective view of a holding element of the pressure compensation device shown in FIG. 1.

FIG. 4 shows a perspective view of the holding element 20 of the pressure compensation devices shown in FIGS. 1 to 3. The bearing surface 50, in this case, is shown hatched to make it easier to see. The webs 30 comprise in each case a first receiving means 65 radially on the inside. The webs 30, in this case, are aligned substantially parallel to the center axis 35 or perpendicular to the bearing surface 50. The first receiving means 65 are delimited in the circumferential direction in each case by a guide band 70 at the side of the web 30. The guide band 70, in this case, is aligned substantially parallel to the center axis 35 of the holding element 20. On a side facing the cover 25, the first receiving means 65 comprises an inner circumferential surface 75 of the web 30. The inner circumferential surface 75 is delimited in the circumferential direction by in each case one guide band 70. The inner circumferential surface 75, in this case is arranged in a slightly inclined manner (within the range of between 0.5° and 5°) in relation to the center axis 35 such that the inner circumferential surface 75 comprises an obtuse angle in relation to the bearing surface 50 in order, on the one hand, to enable a casting mold to be removed in the aluminum casting process of the holding element 20 and, on the other hand, when mounting the cover 25 on the holding element 20, to clamp said cover in the first receiving means 56 at a greater insertion depth on the circumferential side.

Stop elements 80 are arranged radially on the outside of the bearing surface 50. The stop elements 80 have in each case at the top a stop surface 85 which is aligned perpendicular to the center axis 35.

A second recess 90, which is realized in a ring-shaped manner, is arranged extending circumferentially about the bearing surface 50 between the bearing surface 50 and the webs 30. A recess bottom 95 of the second recess 90, in this case, is arranged deeper in the direction of the housing 50 than the bearing surface 50. In the embodiment, the first recess 40 and the second recess comprise the common recess bottom 95. Draining liquids out of the holding element 20 is reliably ensured in this way. As an alternative to this, it would also be conceivable for the first recess 40 to comprise its own further recess bottom which is advantageously arranged deeper in the direction of the housing 15 than the recess bottom 95 of the second recess 90 in order to ensure water drainage from the pressure compensation device. As a result of the second recess 90, an annular portion 96, on the top surface of which the bearing surface 50 is arranged perpendicularly to the center axis 35, is provided on the holding element 20.

Figure 5:
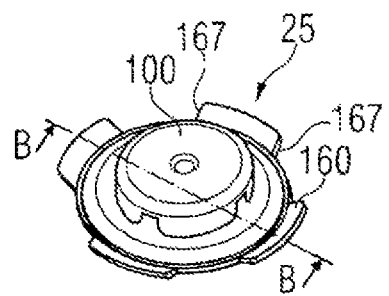
FIG. 5 shows a cover of the pressure compensation device shown in FIG. 1.
Figure 6:
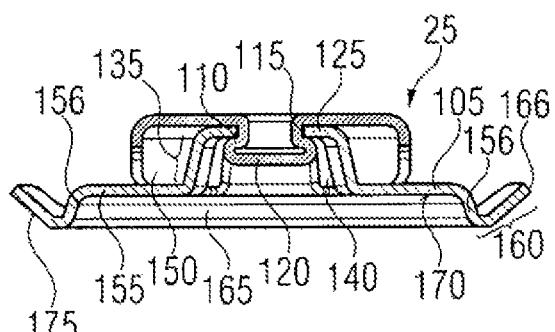
FIG. 6 shows a sectional view through the cover shown in FIG. 5.

FIG. 5 shows a perspective view of the cover 25 and FIG. 6 shows a sectional view through the cover 25 along a cutting plane B-B shown in FIG. 5.

The cover 25 comprises a first cover element 100 and a second cover element 105 which is arranged below the first cover element 100. The first cover element 100, in this case, is realized in a hollow-cylindrical manner and is connected to the second cover element 105 by means of a rivet connection 110. To this end, the second cover element 105 has a third recess 115 which is arranged centrally in an end-face portion 125, through which a protrusion 120 of the first cover element 110 projects, the protrusion 120 engaging behind the end-face portion 125 of the second cover element 105 at the back, that is on the side remote from the first cover element 100. In this way, the first cover element 100 can be connected simply and cost-efficiently to the second cover element 105.

Figure 7:
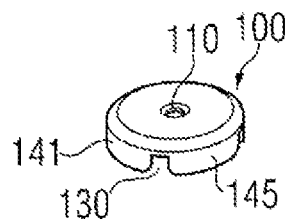
FIG. 7 shows a perspective view of a first cover element of the cover shown in FIGS. 5 and 6.
Figure 8:
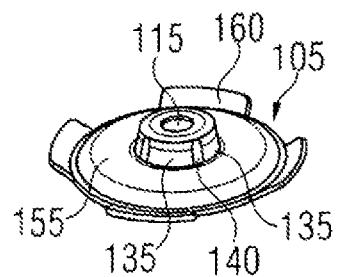
FIG. 8 shows a perspective view of a second cover elements of the cover shown in FIG. 5 and FIG. 6.

FIG. 7 shows a perspective view of the first cover element 100 and FIG. 8 shows a perspective view of the cover 25 shown in FIGS. 5 and 6.

On the circumferential side, the first cover element 100 comprises a second passage 130 which is distributed at a regular spacing in the circumferential direction on one circumferential side 131. Obviously, an irregular arrangement of the second passage 130 is also conceivable. The first cover element 100 has in each case a side portion 145 between every two second passages 130.

In a (hollow) cylindrical portion 135 which adjoins the first end-face portion 125, the second cover element 105 comprises a third passage 140. The first cover element 100, in this case, is aligned twisted in relation to the center axis 35 in such a manner in relation to the second cover element 105 that the second passage 130 does not overlap the third passage 140, but rather the third passage 140 is covered by the side portion 145. Consequently, a labyrinth-type channel 150—for example a channel 150 that extends in a kinked and/or bent manner—is provided on the cover 25 which avoids a direct liquid jet, for example, being able to contact the diaphragm 60 in a direct manner. In addition, the second or third passage 130, 140 enables water to drain from the cover 25. The second or third passage 130, 140 can be admitted in a simple manner within the framework of the production of the first cover element 100 or of the second cover element 105 in a punching-bending process.

The second cover element 105, adjoining the cylindrical portion 125, has a second end-face portion 155 which is arranged substantially perpendicular to the center axis 35 and consequently parallel to the first end-face portion 125. In this case, the second end-face portion is arranged on the radial outside of both the first end-face portion 125 and of the cylindrical portion 135. A second (hollow) cylindrical portion 156, to which a holding portion 160, which is realized in a cone-like manner, connects on the radial outside, is arranged on the radial outside of the second end-face portion 155. Together with the second end-face portion 155, the second cylindrical portion 156 forms a second receiving means 165. The first cylindrical portion 135 and the second cylindrical portion 156 extend in opposite directions with reference to the second end-face portion 155.

On the inside surface, that is on the end-face side of the second end-face portion 155 that faces the bearing surface 50, the second receiving means 165 or the second end-face portion 155 comprises a pressure surface 170. Said pressure surface is realized in a ring-shaped manner and is realized in a more advantageous manner identically to the bearing surface 50 of the holding element 10. With the cover 25 in the mounted state, the pressure surface 170 is aligned parallel to the bearing surface 50 of the holding element 20. The second receiving means 165, in this case, with the cover 25 in the mounted state, is realized to receive the diaphragm 60 and the annular portion 96 substantially entirely or to encompass them on the circumferential side by means of the second cylindrical portion 156. In this case, the second receiving means 167 or the pressure surface presses the diaphragm 60 onto the bearing surface 50.

The holding portions 160 are arranged extending circumferentially in portions on the circumferential side. On the radial outside, in each case one holding portion 160 comprises a clamping edge 166 which corresponds to the edge of the holding element 160 which is located the furthest radially on the outside and extends on the circumferential side. The holding portions 160 incline obliquely upward from the bearing surface 50 in FIG. 6.

If the cover 25 is introduced into the holding element 20 in the mounting direction or the insertion direction E, which comprises an identical directional vector as the pressing force F, the holding portions 160 are encompassed by the guide band 70 at the side on in each case one side surface 167 of the holding portion 160. In addition, the holding portion 160 deflects against the insertion direction E, the clamping edge 166 abutting against the inner circumferential surface 75 of the first receiving means 65. An end position of the cover 25 is delimited by end-face striking of the cover 25 in the second end-face portion 125 against the stop surface of the stop element 80. In this way, pressing-in or realizing the adhesive layer 25 in too thin a manner can be avoided.

If the cover 25 is situated in its end position, the diaphragm 60 is pressed by the pressure surface 170 onto the adhesive layer 55 with the pressing force F. In this way, unintended detaching of the diaphragm 60 if the adhesive layer is damaged is reliably avoided. A slow-hardening adhesive can also be chosen for the adhesive layer 55 in the production process as a result of the diaphragm 60 being pressed by the cover 25 as initial fastening is reliably ensured by the cover 25. In the end position, the second cylindrical portion 156 and the holding portion 160 are received by the second recess 90 such that a particularly flat and compact pressure compensation device 10 can be provided.

The cover 25 slipping out or the cover 25 becoming unintentionally detached is avoided as a result of the holding portion 160 being clamped on the clamping edge 166 at the inner circumferential surface 75.

In this case, the cone-like realization of the holding portions 160, with an alignment of the holding portions 160 inclined with respect to the center axis or inclined rearwardly against the insertion direction or the pressing force F, ensures that the holding portions 160 in the deflected state press against the inner circumferential surface 175 or are widened when the cover 25 is removed, and thus block the removal of the cover 25 from the holding element 20 in a reliable manner. As a result, it is also ensured that the pressing force F is provided reliably over the service life of the pressure compensation device 10.

In order to avoid corrosion of the bearing surface 50 and consequently damage to the adhesive connection between the adhesive layer 55 and the bearing surface 50, the holding element 20 comprises a first material, in particular aluminum. The first material, in this case, has a first electrochemical potential. The cover 25 comprises a second material, in an advantageous manner steel, with a second electrochemical potential. In this case, the second material is chosen in such a manner that its second electrochemical potential is lower than the first electrochemical potential of the first material. As a result, the cover 25 acts as an anode and serves as a corrosion element such that corrosion of the bearing surface 50 of the holding element 20 and consequently of the adhesive connection between the adhesive layer 55 and the bearing surface 50 can be reliably avoided.

In order to avoid contact corrosion between the cover 25 and the holding element 20 in portions at which the cover 25 is in touching contact with the holding element 20, a coating 175, which comprises a third material with a third electrochemical potential, is applied on the cover 25, in particular on the second cover element 105. In this case, the third material is chosen in such a manner in relation to the first material of the holding element 20 that the third electrochemical potential is substantially identical to the first electrochemical potential of the first material. In particular, it is conceivable, for example, for the coating 175 to include a ZnAlMg alloy in the embodiment.

The advantage of the above-described pressure compensation device 10 is that if a water jet is directed directly onto the pressure compensation device 10, the diaphragm 60 is protected by the cover 25 against direct contact between the water jet and the diaphragm 60. In addition, the water jet is also reliably prevented from being able to penetrate at the side under the diaphragm 60 in the region of the adhesive layer 55 and thus from being able to damage the adhesive connection between the adhesive layer 55 and the diaphragm 60, on the one hand and, on the other hand, between the adhesive layer 55 and the bearing surface 50. At the same time, as a result of the realization of the channel 150 via the first passage 150, the second passage 130 and the third passage 140, the cover 25 enables gas to be exchanged through the gas-permeable diaphragm 60 that is arranged in the channel 150. Should liquid droplets be present, for example, in the form of a mist or should standing or draining liquids be present on or in the cover 25, the liquid-proof diaphragm 60 prevents the ingress of liquids into the housing 15. Gases can still penetrate into the housing such that reliable pressure compensation is possible between a housing interior 180 of the housing 15 and a surrounding area 185.

Although the invention has been illustrated and described in more detail by the preferred exemplary embodiment, the invention is not limited by the disclosed examples and other variations can be derived herefrom by the expert without departing from the scope of protection of the invention.

In the figures, the holding portions 160 or the webs 30 are distributed, as an example, uniformly in the circumferential direction on the second cover element 105. Obviously, a non-uniform distribution or a different number of webs 30 or holding portions 160 are also conceivable. It is also conceivable for the holding portion 160 to be realized extending circumferentially all the way around. It is also conceivable for the guide band 130 to be dispensed with for this purpose or a reduced number of guide bands 70 to be provided.

As an alternative to the stop element 80, it would also be conceivable to delimit the end position of the cover 25 by way of the insertion force F.

In the embodiment, the cover 25 is produced using a punching-bending method and the holding element 20 or the housing 15 is produced using a pressure casting method. Other production methods are obviously also conceivable. The connection between the first cover element 100 and the second cover element 105 as a rivet joint 110 is also an example. As an alternative to this, it would also be conceivable for the first cover element 100 to be connected to the second cover element 105 by means of a materially-bonded and/or positive-locking connection, in particular a weld joint or an adhesive joint. It would also be conceivable for the cover 25 to consist exclusively of the second cover element 105. The important factor in this case, however, is that the cover 25 receives the diaphragm 60 into the second receiving means 165 and presses it onto the bearing surface 50.

The invention claimed is:

1. A pressure compensating device, comprising:
   a diaphragm;
   a holding element having a bearing surface facing said diaphragm;
   a cohesive connection provided on said bearing surface between said diaphragm and said holding element, said cohesive connection fastening said diaphragm on said bearing surface;

a cover clamped on said holding element, said cover having at least one first receptacle at least partly receiving said diaphragm;

said cover pressing said diaphragm onto said cohesive connection and pressing said cohesive connection at least in part onto said bearing surface;

said holding element including a plurality of webs having inner circumferential surfaces; and said cover having an outer circumferential surface and a plurality of holding portions extending radially outward from said outer circumferential surface, said plurality of holding portions pressing against said inner circumferential surfaces of said plurality of webs to thereby clamp said cover to said holding element.

2. The pressure compensating device according to claim 1, wherein:

said cohesive connection is at least one of an adhesive layer or a weld seam; and a clamping connection fastens said cover on said holding element and secures said diaphragm against detachment from said bearing surface in addition to said cohesive connection by means of said pressing.

3. The pressure compensating device according to claim 1, wherein said first receptacle includes a pressure surface being aligned parallel to said bearing surface of said holding element and configured to at least partly abut against said diaphragm.

4. The pressure compensating device according to claim 3, wherein said bearing surface and said pressure surface are congruent.

5. The pressure compensating device according to claim 1, wherein said cover includes a first cover element and a second cover element connected to said first cover element, said first cover element being hollow cylindrical, and said second cover element having a cylindrical portion encompassed at least in part on a circumferential side by said first cover element.

6. The pressure compensating device according to claim 5, wherein:

said first receptacle is disposed in said second cover element;

said plurality of holding portions is provided on said second cover element on a circumferential side of said first receptacle; and said plurality of webs extend substantially perpendicular to said bearing surface.

7. The pressure compensating device according to claim 6, which further comprises a second receptacle provided on said inner circumferential surface of one of said plurality of webs facing said cover, one of said plurality of holding portions of said second cover element engaging into said second receptacle.

8. The pressure compensating device according to claim 6, wherein said one of said plurality of holding portions has at least one protrusion between said bearing surface and said one of said plurality of webs, said at least one protrusion at least partly receiving said one of said plurality of holding portions of said second cover element.

9. The pressure compensating device according to claim 5, wherein said second cover element has a radially outwardly open passage in said cylindrical portion, and said passage is covered at least in part by said first cover element.

10. The pressure compensating device according to claim 1, wherein said holding element has at least one stop element adjoining said bearing surface, said at least one stop element extending in the direction of said cover, and said stop element delimiting a mounting direction of said cover by causing said cover to strike against said at least one stop element.

11. The pressure compensating device according to claim 1, wherein said cover is a corrosion element, said cover is at least partly formed of a first material with a first electrochemical potential, said holding element is formed of a second material with a second electrochemical potential, and said first electrochemical potential of said first material is lower than said second electrochemical potential of said second material.

12. The pressure compensating device according to claim 11, which further comprises a layer disposed on a top surface of said cover, said layer having a third electrochemical potential corresponding substantially to said second electrochemical potential of said second material of said holding element.

13. A housing component for a housing for a control unit, the housing component comprising a pressure compensating device according to claim 1.

14. A control unit, comprising a housing, said housing having a housing component including a pressure compensating device according to claim 1.

15. The pressure compensating device according to claim 1, wherein: said holding element includes a plurality of webs that clamp and said cover to said holding element.

* * * * *